US012267975B1

(12) United States Patent
Jeong et al.

(10) Patent No.: US 12,267,975 B1
(45) Date of Patent: Apr. 1, 2025

(54) MODULE ATTACH/DETACH RACK APPARATUS FOR MODULE TYPE CONTROL AND MONITORING SYSTEM

(71) Applicant: Woori Technologies Corporation, Seoul (KR)

(72) Inventors: Seung kweon Jeong, Seoul (KR); Jung Won Lee, Seoul (KR)

(73) Assignee: Woori Technologies Corporation, Seoul (KR)

( * ) Notice: Subject to any disclaimer, the term of this patent is extended or adjusted under 35 U.S.C. 154(b) by 0 days.

(21) Appl. No.: 18/534,561

(22) Filed: Dec. 8, 2023

(30) Foreign Application Priority Data

Nov. 9, 2023 (KR) .......................... 10-2023-0154152

(51) Int. Cl.
*H05K 7/14* (2006.01)
(52) U.S. Cl.
CPC ................................. *H05K 7/1409* (2013.01)
(58) Field of Classification Search
None
See application file for complete search history.

(56) References Cited

FOREIGN PATENT DOCUMENTS

| JP | 07-212063 A | 8/1995 |
|---|---|---|
| KR | 10-2000-0047118 A | 7/2000 |
| KR | 10-2004-0022818 A | 3/2004 |
| KR | 10-2020-0100423 A | 8/2020 |

OTHER PUBLICATIONS

Decision to grant a patent mailed Aug. 22, 2024 from Korean Industrial Property Office for Korean Patent Application No. 10-2023-0154152 and its English translation.
Notice of Preliminary Rejection mailed Jul. 17, 2024 from Korean Industrial Property Office for Korean Patent Application No. 10-2023-0154152 and its English translation.

*Primary Examiner* — Ross N Gushi
(74) *Attorney, Agent, or Firm* — Insight Law Group, PLLC; Seung Lee

(57) ABSTRACT

A rack apparatus for module attachment/detachment in a modular control and monitoring system is disclosed. In the rack apparatus, individual functional modules configured to perform control and monitoring functions and terminal block modules connected to external devices or external systems by cables and configured to perform input/output interface functions of respective individual functional modules are implemented such that attachment and detachment of the individual functional modules and the terminal block modules are achieved in a separate manner and such that attachment and detachment of the terminal block modules are achieved on the basis of respective individual functional modules. Accordingly, it is possible to easily and conveniently replace a failed one of the individual functional modules with a new one without requiring a cable connection task.

5 Claims, 3 Drawing Sheets

MODULE ATTACH/DETACH RACK APPARATUS FOR MODULE TYPE CONTROL AND MONITORING SYSTEM

CROSS-REFERENCE TO RELATED APPLICATIONS

The present application claims the benefit of Korean Patent Application No. 10-2023-0154152, filed Nov. 9, 2023, in the Korean Intellectual Property Office, the disclosure of which is incorporated herein in its entirety by reference.

BACKGROUND OF THE INVENTION

Field of the Invention

The present invention relates to a control and monitoring system, and more particularly to a rack apparatus for module attachment/detachment in a modular control and monitoring system.

Description of the Related Art

A modular control and monitoring system configured to detachably attach a plurality of modules to a rack apparatus may be implemented. In association with such modules, to which various input/output or communication cables are connected, for transmission and reception of signals between the modules and external devices or external systems, however, there is inconvenience in that, when a failed module is replaced with a new one, a cable associated with the failed module should be disconnected, and should then be again connected after module replacement.

To this end, the present inventor conducted research on a technology for implementing, in a modular control and monitoring system, individual functional modules configured to perform control and monitoring functions and terminal block modules connected to external devices or external systems by cables and configured to perform input/output interface functions of respective individual functional modules such that attachment and detachment of the individual functional modules and the terminal block modules are achieved in a separate manner and such that attachment and detachment of the terminal block modules are achieved on the basis of respective individual functional modules, thereby being capable of easily and conveniently replacing a failed one of the individual functional modules with a new one without requiring a cable connection task.

RELATED ART LITERATURE

Patent Documents

Patent Document 1: Korean Patent Unexamined Patent Publication No. 10-2000-0047118 (issued on Jul. 25, 2000)

SUMMARY OF THE INVENTION

Therefore, the present invention has been made in view of the above problems, and it is an object of the present invention to provide to a rack apparatus for module attachment/detachment in a modular control and monitoring system, in which individual functional modules configured to perform control and monitoring functions and terminal block modules connected to external devices or external systems by cables and configured to perform input/output interface functions of respective individual functional modules are implemented such that attachment and detachment of the individual functional modules and the terminal block modules are achieved in a separate manner and such that attachment and detachment of the terminal block modules are achieved on the basis of respective individual functional modules, thereby being capable of easily and conveniently replacing a failed one of the individual functional modules with a new one without requiring a cable connection task.

In accordance with the present invention, the above and other objects can be accomplished by the provision of a rack apparatus for module attachment/detachment in a modular control and monitoring system, including an individual functional module receiver configured such that individual functional modules of the modular control and monitoring system are horizontally attached thereto or detached therefrom at an upper side of a front surface thereof, the individual functional module receiver being formed with lower openings configured to allow connection slots formed at lower portions of the individual functional modules to be downwardly exposed, respectively, a terminal block module receiver configured such that the individual functional modules of the modular control and monitoring system are horizontally attached thereto or detached therefrom at a lower side of a front surface thereof, the terminal block module receiver being formed with upper openings configured to allow connection pins formed at upper portions of the terminal block modules to be upwardly exposed, respectively, and a vertical attachment/detachment guide unit configured to guide the connection pins formed at respective upper portions of the terminal block modules received in the terminal block module receiver to be vertically attached to or detached from the connection slots formed at respective lower portions of the individual functional modules received in the individual functional module receiver, respectively.

In accordance with an embodiment of the present invention, the vertical attachment/detachment guide unit may include a vertical connection driver coupled to the lower portion of one of the terminal block modules and configured to upwardly move the terminal block module such that the connection pin formed at the upper portion of the terminal block module is coupled to the connection slot formed at one of the individual functional modules, for connection therebetween, and a vertical disconnection driver coupled to the upper portion of the terminal block module and configured to downwardly move the terminal block module such that the connection pin formed at the upper portion of the terminal block module is separated from the connection slot formed at the lower portion of the individual functional module coupled to the connection pin, for disconnection therebetween.

In accordance with another embodiment of the present invention, the vertical connection driver may include a lower support rail slidably coupled to the lower portion of the terminal block module, a lower front pivotal member pivotally coupled to a front side of the lower support rail, a lower rear pivotal member coupled to a guide groove formed at a rear side of the lower support rail, to pivot while moving along the guide groove, and a lower lever coupled to the lower front pivotal member and configured to force the lower front pivotal member and the lower rear pivotal member to pivot in accordance with pressing manipulation of a user, thereby causing the lower support rail to move upwards, such that, in accordance with upward movement of the lower support rail, the terminal block module coupled to the upper portion of the lower support rail is moved upwards, thereby causing the connection pin formed at the upper portion of the terminal block module to be coupled to the connection slot formed at the lower portion of the individual functional module, for connection therebetween.

In accordance with another embodiment of the present invention, the vertical disconnection driver may include an upper support rail slidably coupled to the upper portion of the terminal block module, an upper front pivotal member pivotally coupled to a front side of the upper support rail, an upper rear pivotal member coupled to a guide groove formed at a rear side of the upper support rail, to pivot while moving along the guide groove, and an upper lever coupled to the upper front pivotal member and configured to force the upper front pivotal member and the upper rear pivotal member to pivot in accordance with raising manipulation of a user, thereby causing the upper support rail to move downwards such that, in accordance with downward movement of the upper support rail, the terminal block module coupled to the lower portion of the upper support rail is moved downwards, thereby causing the connection pin formed at the upper portion of the terminal block module to be separated from the connection slot formed at the lower portion of the individual functional module coupled to the connection pin, for disconnection therebetween.

In accordance with still another embodiment of the present invention, the vertical attachment/detachment guide unit may further include a vertical guide rail coupled to a rear portion of the terminal block module, to guide sliding of the terminal block module moving upwards or downwards.

In accordance with the present invention, in the modular control and monitoring system according to the present invention, the individual functional modules configured to perform control and monitoring functions and the terminal block modules connected to external devices or external systems by cables and configured to perform input/output interface functions of respective individual functional modules, are implemented such that attachment and detachment of the individual functional modules and the terminal block modules are achieved in a separate manner such that attachment and detachment of the terminal block modules are achieved on the basis of respective individual functional modules. Accordingly, the present invention has an effect in that it may be possible to easily and conveniently replace a failed one of the individual functional modules with a new one without requiring a cable connection task and, as such, easy maintenance and repair of the modular control and monitoring system may be achieved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
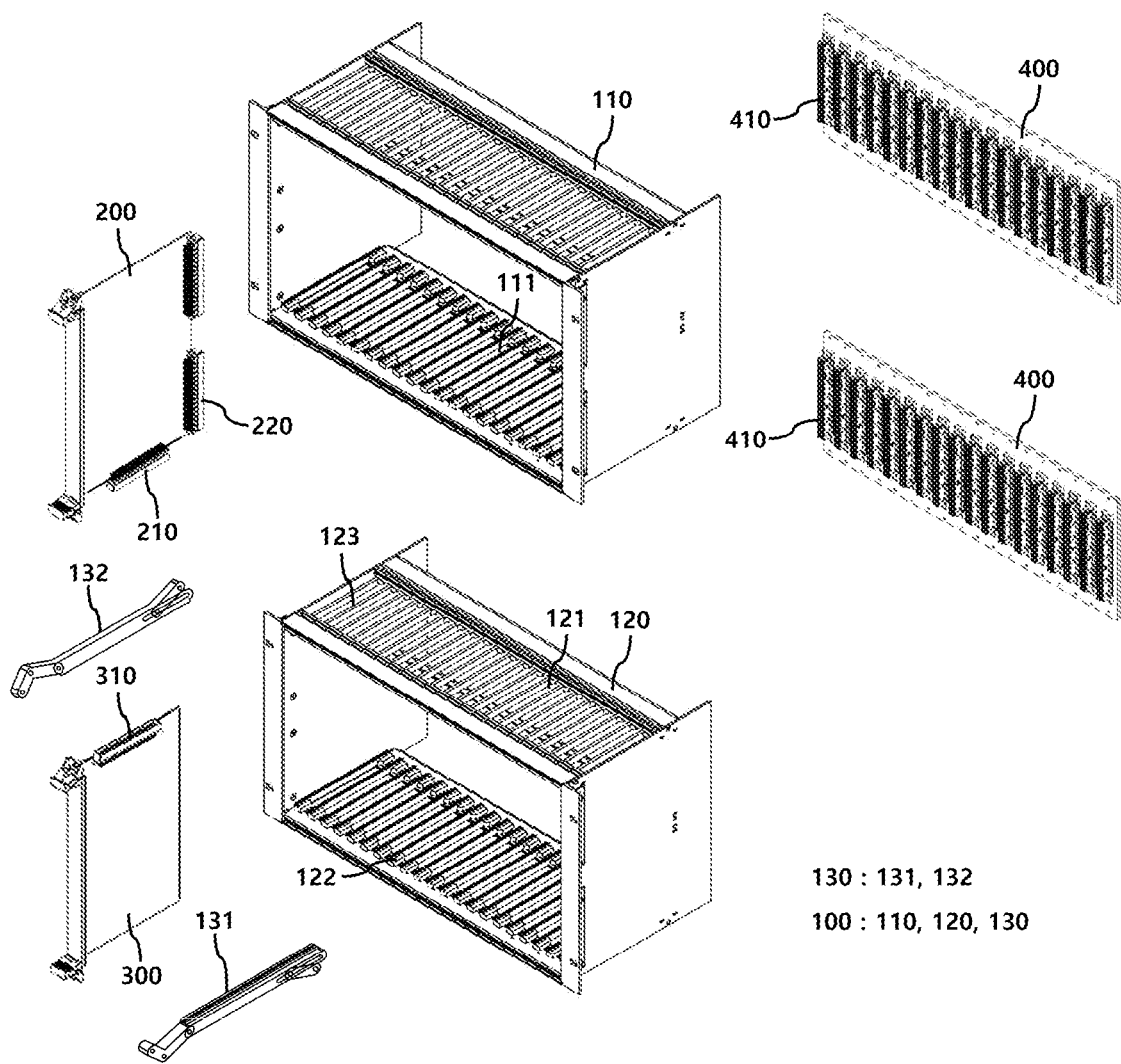
FIG. 1 is an exploded perspective view showing a configuration of a rack apparatus for module attachment/detachment in a modular control and monitoring system according to an embodiment of the present invention.

Hereinafter, preferred embodiments of the present invention will be described in detail with reference to the accompanying drawings as and, such, may be easily implemented by one of ordinary skill in the art to which the present invention pertains. Although specific embodiments are illustrated in the drawings, and detailed description thereof is given, the present invention may be embodied in many different forms and should not be construed as limited to the embodiments set forth herein.

In the following description, a detailed description of known functions and configurations incorporated herein will be omitted when it may make the subject matter of the present invention rather unclear.

When an arbitrary component is described as "being connected to" or "being linked to" another component, this should be understood to mean that other component(s) may exist therebetween, although the arbitrary component may be directly connected to, or linked to, the second component.

On the other hand, when an arbitrary component is described as "being directly connected to" or "being directly linked to" another component, this should be understood to mean that no component exists therebetween.

FIG. 1 is an exploded perspective view showing a configuration of rack apparatus for module a attachment/detachment in a modular control and monitoring system according to an embodiment of the present invention. As shown in FIG. 1, the rack apparatus for module attachment/detachment according to this embodiment, which is designated by reference numeral "100", includes an individual functional module receiver 110, a terminal block module receiver 120, and a vertical attachment/detachment guide unit 130. In this case, the individual functional module receiver 110 and the terminal block module receiver 120 may be mounted at upper and lower sides in an interior of an outer box (not shown), respectively.

The individual functional module receiver 110 is configured such that individual functional modules 200 of the modular control and monitoring system are horizontally attached thereto or detached therefrom at an upper side of a front surface thereof. The individual functional module receiver 110 is formed with lower openings 111 configured to allow connection slots 210 formed at lower portions of the individual functional modules 200 to be downwardly exposed, respectively. In this case, the individual functional modules 200 may be control modules configured to perform functions for industrial equipment control and monitoring, various sensor modules, input/output (I/O) modules, calculation modules, etc.

For example, the individual functional module receiver 110 may be configured to have a cuboidal box shape opened at front and rear surfaces thereof while being formed, at a lower surface thereof, with lower openings 111 spaced apart from one another by a uniform distance. The individual functional module receiver 110 may also be configured to enable a rear PCB 400 to be mounted at the opened rear surface thereof. The rear PCB 400 includes a plurality of slots 410 for receiving connector pins 220 formed at rear surfaces of the individual functional modules 200, for connection thereof, respectively.

The terminal block module receiver 120 is configured such that the individual functional modules 200 of the modular control and monitoring system are horizontally attached thereto or detached therefrom at a lower side of a front surface thereof. The terminal block module receiver 120 is formed with upper openings 121 configured to allow connection pins 310 formed at upper portions of the terminal block modules 300 to be upwardly exposed, respectively.

In this case, the terminal block modules 300 are connected, one by one, to the individual functional modules 200 through connector pins, and are connected to external devices or external systems via cables. In this regard, the terminal block modules 300 may be interface modules configured to perform a terminal function for signal transmission between the individual functional modules 200 and the external devices or external systems.

For example, the terminal block module receiver 120 may be configured to have a cuboidal box shape opened at front and rear surfaces thereof while being formed, at an upper surface thereof, with upper openings 121 spaced apart from one another by a uniform distance. In this case, the terminal block module receiver 120 may be configured to have the same shape as that of the individual functional module receiver 110.

The vertical attachment/detachment guide unit 130 guides the connection pins 310 formed at respective upper portions of the terminal block modules 300 received in the terminal block module receiver 120 to be vertically attached to or detached from the connection slots 210 formed at respective lower portions of the individual functional modules 200 received in the individual functional module receiver 110, respectively. In this case, the vertical attachment/detachment guide unit 130 may include a vertical connection driver 131 and a vertical disconnection driver 132.

The vertical connection driver 131 is coupled to the lower portion of one terminal block module 300 and is configured to upwardly move the terminal block module 300 such that the connection pin 310 formed at the upper portion of the terminal block module 300 is coupled to the connection slot 210 formed at one individual functional module 200, for connection therebetween.

In this case, the vertical connection driver 131 may be implemented in plural such that a plurality of vertical connection drivers 131 is mounted along a plurality of lower guide rails 122 disposed at a lower side of an inner space of the terminal block module receiver 120, respectively, while being spaced apart from one another by a uniform distance.

The vertical disconnection driver 132 is coupled to the upper portion of the terminal block module 300 and is configured to downwardly move the terminal block module 300 such that the connection pin 310 formed at the upper portion of the terminal block module 300 is separated from the connection slot 210 formed at the lower portion of the individual functional module 200 coupled to the connection pin 310, for disconnection therebetween.

In this case, the vertical disconnection driver 132 may be implemented in plural such that a plurality of vertical disconnection drivers 132 is mounted along a plurality of upper guide rails 123 disposed at an upper side of the inner space of the terminal block module receiver 120, respectively, while being spaced apart from one another by a uniform distance. Meanwhile, the upper openings 121 are formed among the upper guide rails 123, respectively.

Figure 2:
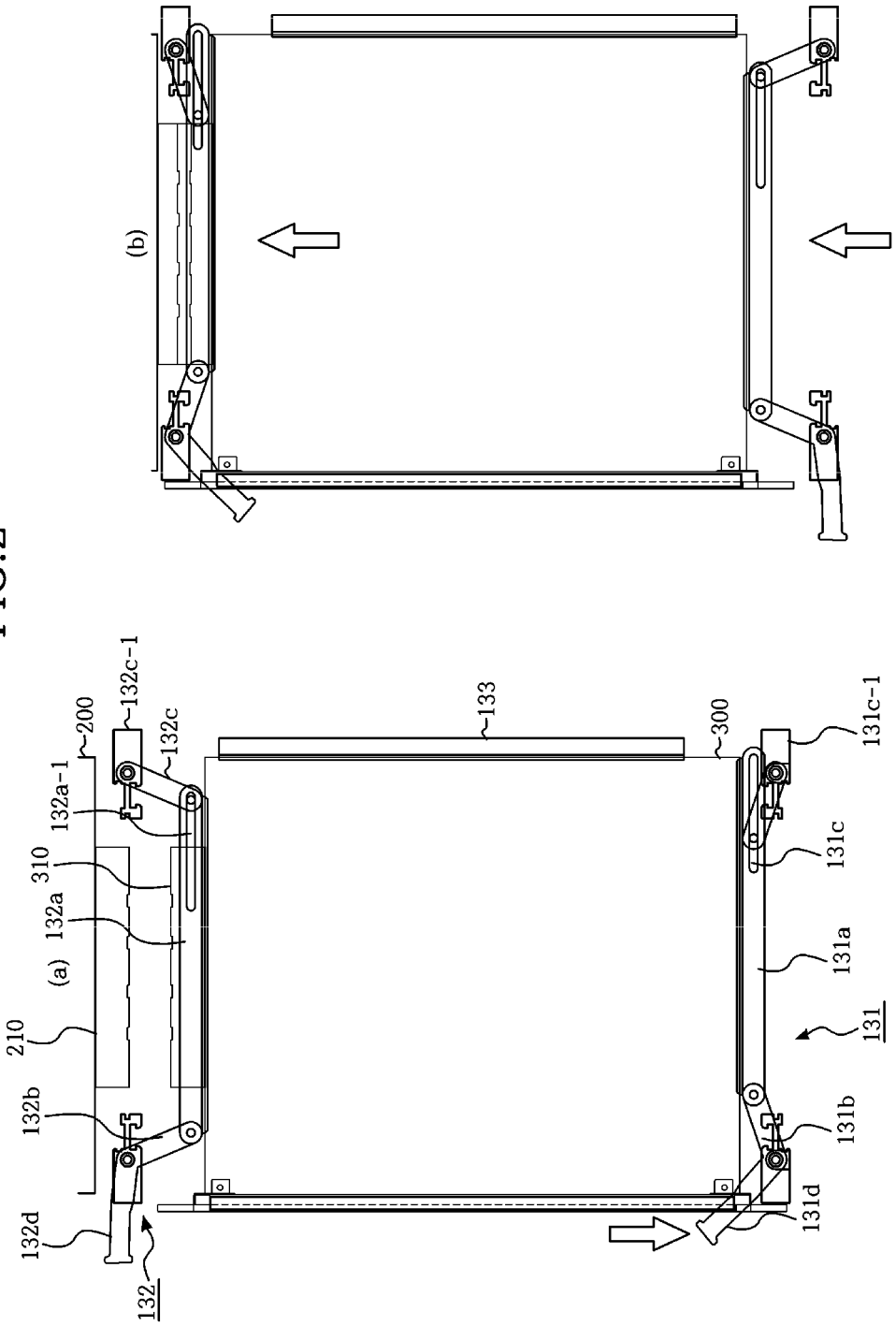
FIG. 2 is a view illustrating vertical mounting or attachment of one terminal block module to one individual functional module in the modular control and monitoring system according to the present invention.
Figure 3:
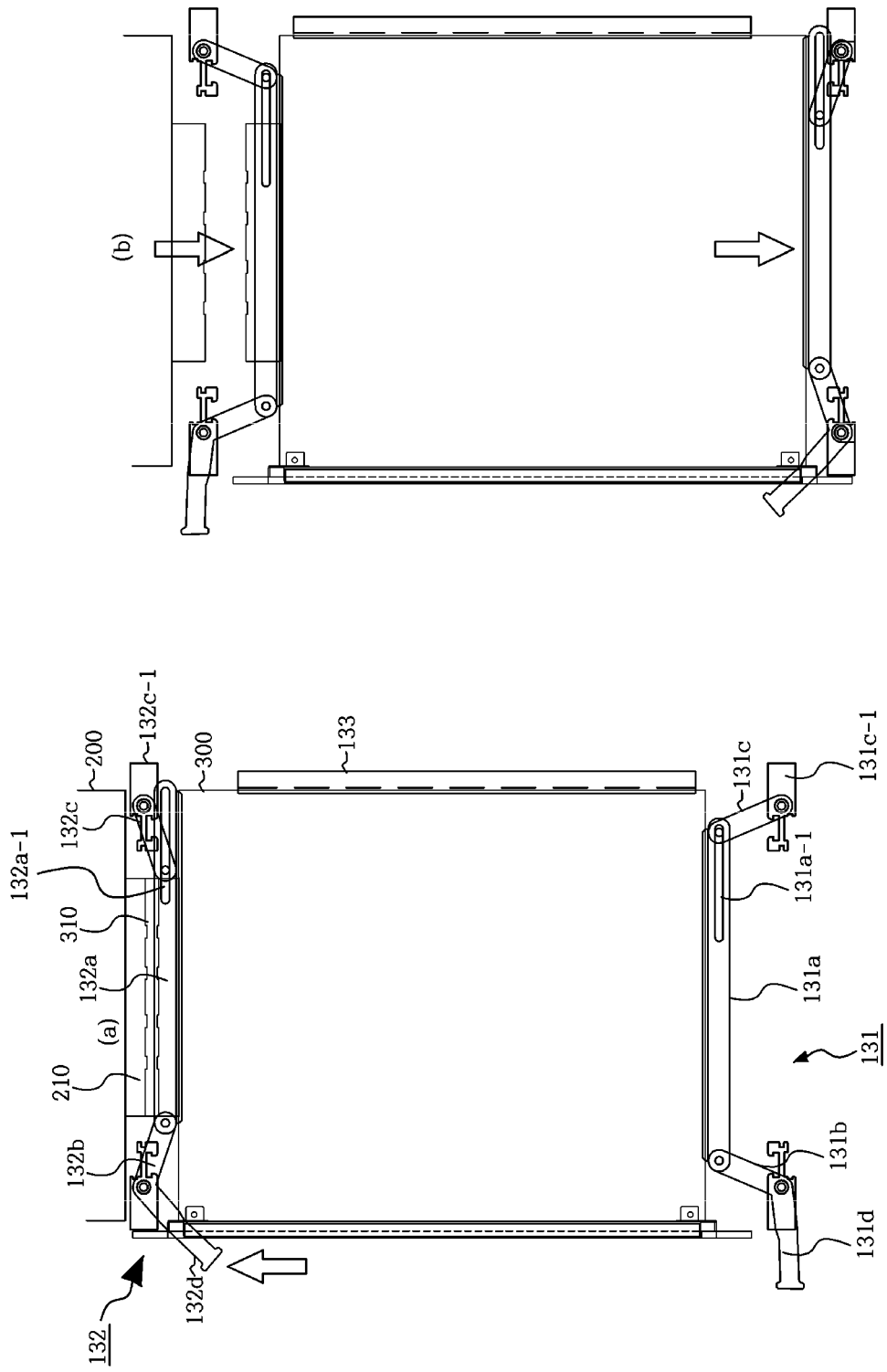
FIG. 3 is a view illustrating vertical detachment of the terminal block module from the individual functional module in the modular control and monitoring system according to the present invention.

FIG. 2 is a view illustrating vertical mounting or attachment of one terminal block module to one individual functional module in the modular control and monitoring system according to the present invention. FIG. 3 is a view illustrating vertical detachment of the terminal block module from the individual functional module in the modular control and monitoring system according to the present invention.

As shown in FIGS. 2 and 3, the vertical connection driver 131 may include a lower support rail 131a, a lower front pivotal member 131b, a lower rear pivotal member 131c, and a lower lever 131d.

The lower support rail 131a is slidably coupled to the lower portion of the terminal block module 300. In this case, a sliding groove may be formed at an upper portion of the lower support rail 131a such that a lower surface of the terminal block module 300 is slidably coupled to the sliding groove while contacting the sliding groove.

The lower front pivotal member 131b is pivotally coupled to a front side of the lower support rail 131a. The lower front pivotal member 131b may pivot upwards and downwards about a pivot axis thereof at the front side of the lower support rail 131a.

The lower rear pivotal member 131c is coupled to a guide groove 131a-1 formed at a rear side of the lower support rail 131a, to pivot while moving along the guide groove 131a-1. In this case, the lower rear pivotal member 131c is coupled, at one end thereof, to the guide groove 131a-1 formed at the rear side of the lower support rail 131a while being pivotally coupled, at the other end thereof, to a support portion 131c-1. Accordingly, the lower rear pivotal member 131c may pivot about a pivot axis thereof while moving along the guide groove 131a-1.

The lower lever 131d is coupled to the lower front pivotal member 131b. In accordance with pressing manipulation of the user, the lower lever 131d forces the lower front pivotal member 131b and the lower rear pivotal member 131c to pivot, thereby causing the lower support rail 131a to move upwards. In accordance with upward movement of the lower support rail 131a, the terminal block module 300 coupled to the upper portion of the lower support rail 131a is moved upwards, thereby causing the connection pin 310 formed at the upper portion of the terminal block module 300 to be coupled to the connection slot 210 formed at the lower portion of the individual functional module 200, for connection therebetween.

Meanwhile, the vertical connection driver 131 may be implemented such that a pivot axis portion thereof, at which the front side of the lower support rail 131a and the lower front pivotal member 131b are pivotally coupled to each other, and the support portion 131c-1 thereof are mounted to a corresponding one of the plurality of uniformly-spaced lower guide rails 122 disposed at the lower side of the inner space of the terminal block module receiver 120, to reciprocally move in a horizontal direction along the corresponding lower guide rail 122.

As shown in FIGS. 2 and 3, the vertical disconnection driver 132 may include an upper support rail 132a, an upper front pivotal member 132b, an upper rear pivotal member 132c, and an upper lever 132d.

The upper support rail 132a is slidably coupled to the upper portion of the terminal block module 300. In this case, a sliding groove (not shown) may be formed at a lower portion of the upper support rail 132a such that an upper surface of the terminal block module 300 is slidably coupled to the sliding groove (not shown) while contacting the sliding groove.

Meanwhile, the connection pin 310 formed at the upper portion of the terminal block module 300 is installed to be biased to one side of the terminal block module 300. Accordingly, although the upper support rail 132a is slidably coupled to the upper portion of the terminal block module 300, there is no interference caused by the connection pin 310.

The upper front pivotal member 132*b* is pivotally coupled to a front side of the upper support rail 132*a*. The upper front pivotal member 132*b* may pivot upwards and downwards about a pivot axis thereof at the front side of the upper support rail 132*a*.

The upper rear pivotal member 132*c* is coupled to a guide groove 132*a*-1 formed at a rear side of the upper support rail 132*a*, to pivot while moving along the guide groove 132*a*-1. In this case, the upper rear pivotal member 132*c* is coupled, at one end thereof, to the guide groove 132*a*-1 formed at the rear side of the upper support rail 132*a* while being pivotally coupled, at the other end thereof, to a support portion 132*c*-1. Accordingly, the upper rear pivotal member 132*c* may pivot about a pivot axis thereof while moving along the guide groove 132*a*-1.

The upper lever 132*d* is coupled to the upper front pivotal member 132*b*. In accordance with raising manipulation of the user, the upper lever 132*d* forces the upper front pivotal member 132*b* and the upper rear pivotal member 132*c* to pivot, thereby causing the upper support rail 132*a* to move downwards. In accordance with downward movement of the upper support rail 132*a*, the terminal block module 300 coupled to the lower portion of the upper support rail 132*a* is moved downwards, thereby causing the connection pin 310 formed at the upper portion of the terminal block module 300 to be separated from the connection slot 210 formed at the lower portion of the individual functional module 200 coupled to the connection pin 310, for disconnection therebetween.

Meanwhile, the vertical disconnection driver 132 may be implemented such that a pivot axis portion thereof, at which the front side of the upper support rail 132*a* and the upper front pivotal member 132*b* are coupled to each other, and the support portion 132*c*-1 thereof are mounted to a corresponding one of the plurality of uniformly-spaced upper guide rails 123 disposed at the upper side of the inner space of the terminal block module receiver 120, to reciprocally move in a horizontal direction along the corresponding upper guide rail 123.

Hereinafter, an operation in which the terminal block module is vertically mounted to the individual functional module will be described with reference to FIG. 2. First, as shown in FIG. 2(*a*), the terminal block module 300 is mounted under the individual functional module 200 by coupling the vertical connection driver 131 to the lower portion of the terminal block module 300 in a state in which the individual functional module 200 is mounted in the individual functional module receiver 110, coupling the vertical detachment driver 132 to the upper portion of the terminal block module 300, and then horizontally inserting the terminal block module 300 into the terminal block module receiver 120.

When the user presses the lower lever 131*d* coupled to the lower front pivotal member 131*b* by his or her hand in the above-described state, the lower lever 131*d* pivots downwards, thereby causing the pivot axis portion of the vertical connection driver 131, at which the front side of the lower support rail 131*a* and the lower front pivotal member 131*b* are pivotally coupled to each other, to move along the lower guide rail 122 toward the rear side of the lower guide rail 122. Simultaneously, the support portion 131*c*-1 moves along the lower guide rail 122 toward the front side of the lower guide rail 122. Accordingly, the lower front pivotal member 131*b* and the lower rear pivotal member 131*c* pivot to raise the lower support rail 131*a*.

Then, the terminal block module 300 coupled to the upper portion of the lower support rail 131*a* is raised and, as such, the connection pin 310 formed at the upper portion of the terminal block module 300 is coupled to the connection slot 210 formed at the lower portion of the individual functional module 200, for connection therebetween, as shown in FIG. 2(*b*).

Hereinafter, an operation in which the terminal block module is vertically detached from the individual functional module will be described with reference to FIG. 3. First, as shown in FIG. 3(*a*), when the user grips and raises the upper lever 132*d* coupled to the upper front pivotal member 132*b* by his or her hand in a state in which the connection pin 310 formed at the upper portion of the terminal block module 300 is coupled to the connection slot 210 formed at the lower portion of the individual functional module 200, the upper lever 132*d* pivots upwards, thereby causing the pivot axis portion of the vertical disconnection driver 132, at which the front side of the upper support rail 132*a* and the upper front pivotal member 132*b* are pivotally coupled to each other, to move along the upper guide rail 123 toward the rear side of the upper guide rail 123. Simultaneously, the support portion 132*c*-1 moves along the upper guide rail 123 toward the front side of the upper guide rail 123. Accordingly, the upper front pivotal member 132*b* and the upper rear pivotal member 132*c* pivot to lower the upper support rail 132*a*.

Then, the terminal block module 300 coupled to the lower portion of the upper support rail 132*a* is lowered and, as such, the connection pin 310 formed at the upper portion of the terminal block module 300 is separated from the connection slot 210 formed at the lower portion of the individual functional module 200 coupled to the connection pin 310, for disconnection therebetween, as shown in FIG. 3(*b*).

Meanwhile, in accordance with an additional aspect of the present invention, the vertical attachment/detachment guide unit 130 may further include a vertical guide rail 133. The vertical guide rail 133 is coupled to a rear portion of the terminal block module 300, to guide sliding of the terminal block module 300 moving upwards or downwards.

Referring to FIGS. 2 and 3, it may be seen that, when the terminal block module 300 is vertically attached to or detached from the individual functional module 200, the vertical guide rail 133 guides sliding of the terminal block module 300 moving upwards or downwards in a state of being coupled to the rear portion of the terminal block module 300.

As apparent from the above description, in the modular control and monitoring system according to the present invention, the individual functional modules configured to perform control and monitoring functions and the terminal block modules connected to external devices or external systems by cables and configured to perform input/output interface functions of respective individual functional modules are implemented such that attachment and detachment of the individual functional modules and the terminal block modules are achieved in a separate manner and such that attachment and detachment of the terminal block modules are achieved on the basis of respective individual functional modules. Accordingly, it may be possible to easily and conveniently replace a failed one of the individual functional modules with a new one without requiring a cable work and, as such, easy maintenance and repair of the modular control and monitoring system may be achieved.

Various embodiments disclosed in the present specification and the drawings only show specific examples, for better understanding thereof, and are not construed as limiting the scopes of various embodiments of the present invention.

Therefore, it should be interpreted that all variations and modifications derived based on technical ideas of various embodiments of the present invention in addition to the embodiments described herein fall within the scopes of various embodiments of the present invention.

The present invention has industrial applicability in the technical field associated with modular control and monitoring systems and the application technical field thereof.

What is claimed is:

1. A rack apparatus for module attachment/detachment in a modular control and monitoring system, comprising:
    an individual functional module receiver configured such that individual functional modules of the modular control and monitoring system are horizontally attached to the individual functional module receiver or detached from the individual functional module receiver at an upper side of a front surface of the modular control and monitoring system, the individual functional module receiver being formed with lower openings configured to allow connection slots formed at lower portions of the individual functional modules to be downwardly exposed, respectively;
    a terminal block module receiver configured such that terminal block modules for the individual functional modules of the modular control and monitoring system are horizontally attached to the terminal block module receiver or detached from the terminal block module receiver at a lower side of the front surface of the modular control and monitoring system, the terminal block module receiver being formed with upper openings configured to allow connection pins formed at upper portions of the terminal block modules to be upwardly exposed, respectively; and
    a vertical attachment/detachment guide unit configured to guide the connection pins formed at respective upper portions of the terminal block modules received in the terminal block module receiver to be vertically attached to or detached from the connection slots formed at respective lower portions of the individual functional modules received in the individual functional module receiver, respectively,
    wherein the vertical attachment/detachment guide unit comprises:
        a vertical connection driver coupled to the lower portion of one of the terminal block modules and configured to upwardly move the terminal block module such that the connection pin formed at the upper portion of the terminal block module is coupled to the connection slot formed at one of the individual functional modules, for connection therebetween; and
        a vertical disconnection driver coupled to the upper portion of the terminal block module and configured to downwardly move the terminal block module such that the connection pin formed at the upper portion of the terminal block module is separated from the connection slot formed at the lower portion of the individual functional module coupled to the connection pin, for disconnection therebetween.

2. The rack apparatus according to claim 1, wherein the vertical connection driver comprises:
    a lower support rail slidably coupled to the lower portion of the terminal block module;
    a lower front pivotal member pivotally coupled to a front side of the lower support rail;
    a lower rear pivotal member coupled to a guide groove formed at a rear side of the lower support rail, to pivot while moving along the guide groove; and
    a lower lever coupled to the lower front pivotal member and configured to force the lower front pivotal member and the lower rear pivotal member to pivot in accordance with pressing manipulation of a user, thereby causing the lower support rail to move upwards, such that, in accordance with upward movement of the lower support rail, the terminal block module coupled to the upper portion of the lower support rail is moved upwards, thereby causing the connection pin formed at the upper portion of the terminal block module to be coupled to the connection slot formed at the lower portion of the individual functional module, for connection therebetween.

3. The rack apparatus according to claim 2, wherein the vertical attachment/detachment guide unit further comprises:
    a vertical guide rail coupled to a rear portion of the terminal block module, to guide sliding of the terminal block module moving upwards or downwards.

4. The rack apparatus according to claim 1, wherein the vertical disconnection driver comprises:
    an upper support rail slidably coupled to the upper portion of the terminal block module;
    an upper front pivotal member pivotally coupled to a front side of the upper support rail;
    an upper rear pivotal member coupled to a guide groove formed at a rear side of the upper support rail, to pivot while moving along the guide groove; and
    an upper lever coupled to the upper front pivotal member and configured to force the upper front pivotal member and the upper rear pivotal member to pivot in accordance with raising manipulation of a user, thereby causing the upper support rail to move downwards such that, in accordance with downward movement of the upper support rail, the terminal block module coupled to the lower portion of the upper support rail is moved downwards, thereby causing the connection pin formed at the upper portion of the terminal block module to be separated from the connection slot formed at the lower portion of the individual functional module coupled to the connection pin, for disconnection therebetween.

5. The rack apparatus according to claim 4, wherein the vertical attachment/detachment guide unit further comprises:
    a vertical guide rail coupled to a rear portion of the terminal block module, to guide sliding of the terminal block module moving upwards or downwards.

* * * * *